United States Patent [19]
Felps

[11] Patent Number: 6,157,255
[45] Date of Patent: Dec. 5, 2000

[54] HIGH PERFORMANCE OPERATIONAL AMPLIFIER

[75] Inventor: Jimmie D Felps, Colorado Springs, Colo.

[73] Assignee: Agilent Technologies, Palo Alto, Calif.

[21] Appl. No.: 09/239,128

[22] Filed: Jan. 28, 1999

[51] Int. Cl.[7] .................................................. H03F 3/45
[52] U.S. Cl. ........................................ 330/252; 330/257
[58] Field of Search ................................... 330/252, 257, 330/311

[56] References Cited

U.S. PATENT DOCUMENTS

| | | | |
|---|---|---|---|
| 4,891,607 | 1/1990 | Felps ........................................ | 330/296 |
| 4,935,703 | 6/1990 | Poletto ..................................... | 330/255 |
| 5,376,897 | 12/1994 | Yoshino et al. ........................ | 330/252 |
| 5,497,124 | 3/1996 | Yamashita ............................... | 330/255 |
| 5,880,639 | 3/1999 | Sakuragi .................................. | 330/252 |
| 5,936,468 | 8/1999 | Wiese et al. ............................ | 330/257 |
| 5,990,742 | 11/1999 | Suzuki .................................... | 330/257 |

OTHER PUBLICATIONS

Data Sheet from OP–07, Made by Analog Devices, Ultralow Offset Voltage Operational Amplifier, OP07; pp. 1–10.

*Primary Examiner*—Robert Pascal
*Assistant Examiner*—Khanh Van Nguyen
*Attorney, Agent, or Firm*—Alexander J. Neudeck

[57] ABSTRACT

An operational amplifier that may be fabricated on an integrated circuit is disclosed. Three precision emitter followers and four additional transistors comprise the major components of the op-amp. Two of the precision emitter followers are connected to the inverting and non-inverting inputs of the op-amp, respectively. The outputs of these two precision emitter followers are connected together to form a differential pair of precision emitter followers. Four additional transistors are used to convert the differential output of the precision emitter follower differential pair to a single-ended output and to provide gain. Two of the four additional transistors are used to mirror the currents in the drive transistors of the differential pair of precision emitter followers. These two mirrored currents are then fed to the drive and sense transistors of a current mirror respectively to convert the differential currents into a single-ended voltage. This single-ended output is coupled to the third precision emitter follower that is used as an output stage.

9 Claims, 1 Drawing Sheet

HIGH PERFORMANCE OPERATIONAL AMPLIFIER

CROSS-REFERENCE TO RELATED APPLICATIONS

This application is related to the application entitled "PRECISION EMITTER FOLLOWER", also filed by applicant in the United States Patent and Trademark Office on about the same day as the present application, Ser. No. 09/239,418, Hewlett-Packard Docket number 10980266-1.

FIELD OF THE INVENTION

This invention relates generally to analog integrated circuits, and more particularly to operational amplifiers.

BACKGROUND OF THE INVENTION

Operational amplifiers, more commonly known as "op-amps," are a core component in analog circuit designs and analog integrated circuits ("ICs"). An ideal operational amplifier is a differential input, single-ended or differential-ended output amplifier having infinite gain, infinite input impedance, and zero output impedance, and infinite bandwidth. Thus, the operational amplifier is well suited for a variety of applications in integrated circuits including filters, oscillators, converters, regulators, signal processors, and control circuits, just to mention a few.

Real operational amplifiers don't exhibit the idealized characteristics and performance of the ideal op-amp. In particular, real op-amps don't have infinite gain; don't have infinite input impedance; don't have zero output impedance; and, don't have infinite bandwidth.

Accordingly, there is a need in the art for an op-amp that has high input impedance, low input current, sufficient gain-bandwidth product and open loop gain, and can be easily fabricated with an integrated circuit process. Furthermore, to minimize expensive external components and connections, it is desirable that such an op-amp should not require external or discrete parts to achieve these characteristics.

SUMMARY OF THE INVENTION

In a preferred embodiment, the invention provides an operational amplifier that may be fabricated on an integrated circuit and has high input impedance, low input current, and sufficient gain-bandwidth product and open loop gain. An embodiment of the invention includes three precision emitter followers. Two of the precision emitter followers are connected to the inverting and non-inverting inputs of the op-amp, respectively. The outputs of these two precision emitter followers are connected together to form a differential pair of precision emitter followers. Four additional transistors are used to convert the differential output of the precision emitter follower differential pair to a single-ended output and provide gain. Two of the four additional transistors are used to mirror the currents in the drive transistors of the differential pair of precision emitter followers. These two mirrored currents are then fed to the drive and sense transistors of a current mirror respectively to convert the differential currents into a single-ended voltage. This single-ended output is coupled to the third precision emitter follower that is used as an output stage.

DETAILED DESCRIPTION OF THE PREFERRED EMBODIMENTS

Figure 1:
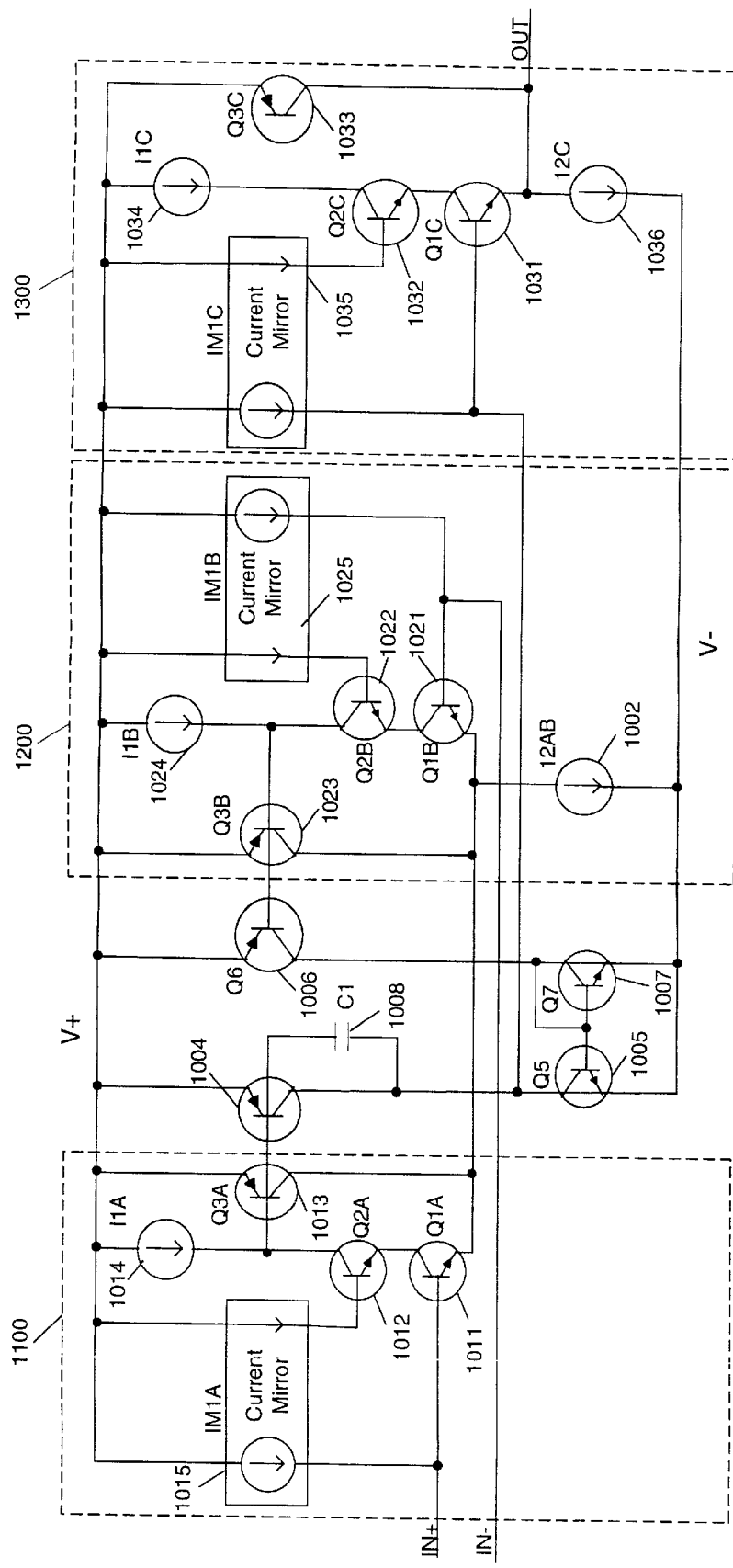
FIG. 1 is schematic diagram of the high performance op-amp.

FIG. 1 is schematic diagram of the high performance op-amp. Three precision emitter followers are included and shown inside boxes 1100, 1200, and 1300. The precision emitter follower is described in U.S. patent application No. 09/239,418, filed on or about the same day as the present invention, Hewlett Packard Company docket number 10980266, entitled "PRECISION EMITTER FOLLOWER" which is hereby incorporated herein by reference.

Precision emitter followers 1100 and 1200 are arranged to form a differential pair of precision emitter followers. The input to precision emitter follower 1100 is the non-inverting input of the op-amp, IN+. The input to precision emitter follower 1200 is the inverting input of the op-amp, IN−. The outputs of precision emitter followers 1100 and 1200 are connected to form a differential pair of precision emitter followers.

In an embodiment, instead of having individual bias current sources in parallel, precision emitter followers 1100 and 1200 share bias current source I2AB 1002. Accordingly, bias current source I2AB may be chosen to conduct twice the bias current used for an individual precision emitter follower.

Transistors Q4 1004, Q5 1005, Q6 1006, and Q7 1007 function to translate the differential nature of the outputs of the differential pair of precision emitter followers into a single-ended output. The base and emitter of transistor Q4 are connected in parallel to the base and emitter respectively of Q3A, the drive transistor of precision emitter follower 1100. This arrangement biases Q4 such that the current flowing out of the collector of Q4 will mirror the current flowing out the collector of Q3A. The base and emitter of transistor Q6 are connect in parallel to the base and emitter respectively of Q3B, the drive transistor of precision emitter follower 1200. This arrangement biases Q6 such that the current flowing out of the collector of Q6 will mirror the current flowing out the collector of Q3B. An optional frequency compensation capacitor, C1 1008 is connected between the base and collector of Q4. This capacitor is added to yield a single pole, open loop, frequency response. Other frequency compensation techniques and component locations could also be used to provide desirable frequency responses.

The collector of Q6 is connected to the base and collector of diode connected sense transistor Q7 1007. The collector of Q6 is also connected to the base of Q5 1005. This arrangement forms a current mirror wherein Q5 is biased such that it attempts to conduct almost the same amount of current as is flowing into the collector of Q7. The collector of Q5 is connected to the collector of Q4 which is connected to the input of precision emitter follower 1300. Under ideal circumstances, when the inputs to the op-amp IN+ and IN− are at approximately the same voltage levels, the currents through transistors Q4 and Q6 will be the same. The current through Q6 sets the current sensed by Q7 which is then mirrored by Q5. Therefore, when the voltage on IN+ and IN− are the same, the voltage on the input to precision emitter follower is at some nominal level.

When the voltages on IN+ and IN− differ, there is a difference in the current coming out of the collector of Q4 and the current going in the collector of Q5. This will result in a voltage change from the nominal voltage on the input of precision emitter follower 1300. Accordingly, transistors Q4, Q5, Q6, Q7 form a differential to single-ended gain stage that inputs to precision emitter follower 1300.

The input of precision emitter follower 1300 is connected to the output of the differential to single-ended gain stage formed by Q4, Q5, Q6, and Q7. The output of precision emitter follower 1300 is the output of the high performance operational amplifier, OUT.

Shown in FIG. 1, precision emitter follower 1100 is biased by current sources I1A 1014 and I2AB 1002. Current source I1A 1014 is set at a bias current of $I1_{BIAS}$. Current source I2AB 1002 is set at $4*I1_{BIAS}$ because I2AB also biases precision emitter follower 1200. One terminal of current source IA 1014 is connected to the positive supply terminal, V+. The other terminal of current source I1A 1014 is connected to the collector of sense transistor Q2A, 1012, and the base of drive transistor Q3A, 1013. This causes a current of $I1_{BIAS}$ to flow from the positive supply terminal through current source I1A 1014 to the node connected to the collector of Q2A. Drive transistor Q3A is chosen to be the opposite type of transistor as Q2A (i.e. when Q2A is an NPN transistor, Q3A is chosen to be a PNP transistor.) The emitter of Q3A is connected to the positive supply terminal, V+. The collector of Q3A is connected to the output of precision emitter follower 1100. The output of precision emitter follower 1100 is also connected to the output of precision emitter follower 1200.

The base of sense transistor Q2A is connected to a sense terminal of a current mirror IM1A 1015 such that the current mirror IM1A 1015 will mirror the current flowing into the base of transistor Q2A. The output terminals of current mirror IM1A 1015 are connected between the positive supply terminal V+ and the input node IN+ so that current mirror IM1A 1015 will deliver an amount of current approximately equal to the base current of transistor Q2A to the input node IN+. The emitter of sense transistor Q2A is connected to the collector of emitter follower transistor Q1A, 1011.

The base of emitter follower transistor, Q1A, is connected to the input node IN+ and current mirror IM1A. The emitter of transistor Q1A is connected to the output node of precision emitter follower 1100. The output node of precision emitter follower 1100 is also connected to one terminal of current source I2AB 1002. The other terminal of current source I2AB 1002 is connected to the negative supply terminal V− so that current source I2AB 1002 causes a bias current of $4*I1_{BIAS}$ to flow from the node connected to the outputs of precision emitter followers 1100 and 1200 to the negative supply terminal V−.

Precision emitter follower 1200 is biased by current sources I1B 1024 and I2AB 1002. Current source I1B 1024 is set at a bias current of $I1_{BIAS}$. Current source I2AB 1002 is set at $4*I1_{BIAS}$ because I2AB also biases precision emitter follower 1100. One terminal of current source I1B 1024 is connected to the positive supply terminal, V+. The other terminal of current source I1B 1024 is connected to the collector of sense transistor Q2B, 1022, and the base of drive transistor Q3B, 1023. This causes a current of $I1_{BIAS}$ to flow from the positive supply terminal through current source I1B 1024 to the node connected to the collector of Q2B. Drive transistor Q3B is chosen to be the opposite type of transistor as Q2B (i.e. when Q2B is an NPN transistor, Q3B is chosen to be a PNP transistor.) The emitter of Q3B is connected to the positive supply terminal, V+. The collector of Q3B is connected to the output of precision emitter follower 1200. The output of precision emitter follower 1200 is also connected to the output of precision emitter follower 1100.

The base of sense transistor Q2B is connected to a sense terminal of a current mirror IM1B 1025 such that the current mirror IM1B 1025 will mirror the current flowing into the base of transistor Q2B. The output terminals of current mirror IM1B 1025 are connected between the positive supply terminal V+ and the input node IN− so that current mirror IM1B 1025 will deliver an amount of current approximately equal to the base current of transistor Q2B to the input node IN−. The emitter of sense transistor Q2B is connected to the collector of emitter follower transistor Q1B, 1021.

The base of emitter follower transistor, Q1B, is connected to the input node IN− and current mirror IM1B. The emitter of transistor Q1B is connected to the output node of precision emitter follower 1200 which is also connected to the output of precision emitter follower 1100. The output node of precision emitter follower 1200 is also connected to one terminal of current source I2AB 1002. The other terminal of current source I2AB 1002 is connected to the negative supply terminal V− so that current source I2AB 1002 causes a bias current of $4*I1_{BIAS}$ to flow from the node connected to the outputs of precision emitter followers 1100 and 1200 to the negative supply terminal V−.

The emitter of transistor Q4 1004 is connected to the positive supply V+. The base of transistor Q4 is connected to the base of transistor Q3A. Hence, Q4 will be biased to mirror the current in the drive transistor of precision emitter follower 1100, Q3A. The emitter of transistor Q6 1006 is connected to the positive supply V+. The base of transistor Q6 is connected to the base of transistor Q3B. Hence, Q6 will be biased to mirror the current in the drive transistor of precision emitter follower 1200, Q3B. An optional frequency compensation capacitor, C1 1008 is connected between the base and collector of Q4. This capacitor is added to yield a single pole, open loop, frequency response.

The collector of transistor Q6 1006 is connected to the base and collector of transistor Q7 1007 and the base of transistor Q5 1005. The emitters of transistors Q7 and Q5 are connected to the negative supply terminal, V−. Hence, the current flowing out of the collector of transistor Q6 flows through Q7 which is the sense transistor of a current mirror formed by Q5 and Q7. Accordingly, Q5 is biased to conduct approximately the same amount of current as flows out the collector of Q6. The collector of Q5 is connected to the collector of Q4 which is connected to the input of precision emitter follower 1300.

Precision emitter follower 1300 is biased by current sources I1C 1034 and I2C 1036. Current source I1C 1034 is set at a bias current of $I3_{BIAS}$. Current source I2C 1036 is set at $2*I3_{BIAS}$. One terminal of current source I1C 1034 is connected to the positive supply terminal, V+. The other terminal of current source I1C 1034 is connected to the collector of sense transistor Q2C, 1032, and the base of drive transistor Q3C, 1033. This causes a current of $I3_{BIAS}$ to flow from the positive supply terminal through current source I1C 1034 to the node connected to the collector of Q2C. Drive transistor Q3C is chosen to be the opposite type of transistor as Q2C (i.e. when Q2C is an NPN transistor, Q3C is chosen to be a PNP transistor.) The emitter of Q3C is connected to the positive supply terminal, V+. The collector of Q3C is connected to the output of precision emitter follower 1300. The output of precision emitter follower 1300 is the output of the op-amp, OUT.

The base of sense transistor Q2C is connected to a sense terminal of a current mirror IM1C 1035 such that the current mirror IM1C 1035 will mirror the current flowing into the base of transistor Q2C. The output terminals of current mirror IM1C 1035 are connected between the positive supply terminal V+ and the input of precision emitter follower 1300 so that current mirror IM1C 1035 will deliver an amount of current approximately equal to the base current of transistor Q2C to the input of precision emitter follower 1300. The emitter of sense transistor Q2C is connected to the collector of emitter follower transistor Q1C, 1031.

The base of emitter follower transistor, Q1C, is connected to the input of precision emitter follower 1300 which is also connected to the collectors of transistors Q4 and Q5. The emitter of transistor Q1C is connected to the output node of precision emitter follower 1300. The output node of precision emitter follower 1300 is also connected to one terminal of current source I2C 1036. The other terminal of current source I2C 1036 is connected to the negative supply terminal V− so that current source I2C 1036 causes a bias current of $2*I3_{BIAS}$ to flow from the output of precision emitter followers 1300 to the negative supply terminal V−.

From the foregoing it will be appreciated that the high performance operational amplifier provided by the present invention offers numerous advantages. Such an op-amp has a high input impedance, low input current, low output impedance, moderate gain-bandwidth product, and moderate open loop gain, and a topology that can be fabricated on high speed complimentary bipolar IC processes.

Although several specific embodiments of the invention have been described and illustrated, the invention is not to be limited to the specific forms or arrangements so described and illustrated. For example, the invention has been shown using NPN bipolar transistors as the emitter follower transistors. With an appropriate translation of parts, the invention could be implemented using PNP bipolar transistors as the emitter follower transistors. Furthermore, the invention can be fabricated in other integrated circuit processes. For example, a non-complementary bipolar process could be used to produce a high performance op-amp if lateral PNP transistors are used. In this case, it may also be desirable to replace precision emitter follower 1300 with a conventional emitter follower. The invention is limited only by the claims.

What is claimed is:

1. An amplifier, comprising:
    a first emitter follower stage, said first emitter follower stage having a first drive transistor, a first emitter follower transistor and said first emitter follower transistor are not the same transistor;
    a second emitter follower stage, said second emitter follower stage having a second drive transistor, a second emitter follower transistor and said second emitter follower transistor are not the same transistor, and wherein said first output and said second output are connected;
    a differential to single-ended gain stage wherein said differential to single-ended gain stage converts a first current flowing in said first drive transistor and a second current flowing in said second drive transistor and produces a single-ended output related to the difference between said first current and said second current, said differential to single-ended gain stage comprising:
        a first mirror transistor, said first mirror transistor being biased to mirror said first current producing first mirror current;
        a first sense transistor, said first sense transistor sensing said first mirror current and biasing a second mirror transistor to mirror said first mirror current producing a second mirror current; and
        a third mirror transistor, said third mirror transistor being biased to mirror said second current to produce a third mirror current; and
    a third emitter follower stage, said third emitter follower coupled to said single-ended output and an amplifier output.

2. The amplifier of claim 1 wherein the difference in said second mirror current and said first mirror current produces said single-ended output.

3. The amplifier of claim 1 wherein said first emitter follower stage and said second emitter follower stage are precision emitter follower stages.

4. The amplifier of claim 3 wherein said first emitter follower stage and said second emitter follower stage share a bias current source.

5. The amplifier of claim 3 wherein said third emitter follower stage is a precision emitter follower stage.

6. An amplifier, comprising:
    a first precision emitter follower, said first precision emitter follower having a first drive transistor, a first emitter follower transistor, and a first output;
    a second precision emitter follower, said second precision emitter follower having a second drive transistor, a second emitter follower transistor, and a second output wherein said first output and said second output are connected;
    a differential to single-ended gain stage wherein said differential to single-ended gain stage converts a first current flowing in said first drive transistor and a second current flowing in said second drive transistor and produces a single-ended output related to the difference between said first current and said second current, said differential to single-ended rain stage comprising:
        a first mirror transistor, said first mirror transistor being biased to mirror said first current producing a first mirror current;
        a first sense transistor, said first sense transistor sensing said first mirror current and biasing a second mirror transistor to mirror said first mirror current producing a second mirror current; and
        a third mirror transistor, said third mirror transistor being biased to mirror said second current to produce a third mirror current; and
    an output stage wherein an input of said output stage is coupled to said single-ended output and an amplifier output.

7. The amplifier of claim 6 wherein the difference in said second mirror current and said first mirror current produces said single-ended output.

8. The amplifier of claim 7 wherein said first precision emitter follower and said second precision emitter follower share a bias current source.

9. The amplifier of claim 8 wherein said output stage is a precision emitter follower.

* * * * *